(12) United States Patent
Kataoka et al.

(10) Patent No.: US 11,075,071 B2
(45) Date of Patent: Jul. 27, 2021

(54) METHOD FOR PROCESSING WAFER

(71) Applicant: Tokyo Seimitsu Co., Ltd., Hachioji (JP)

(72) Inventors: Ryosuke Kataoka, Hachioji (JP); Takashi Tamogami, Hachioji (JP); Syuhei Oshida, Hachioji (JP)

(73) Assignee: TOKYO SEIMITSU CO., LTD., Tokyo (JP)

( * ) Notice: Subject to any disclaimer, the term of this patent is extended or adjusted under 35 U.S.C. 154(b) by 0 days.

(21) Appl. No.: 16/867,126

(22) Filed: May 5, 2020

(65) Prior Publication Data
US 2020/0266047 A1 Aug. 20, 2020

Related U.S. Application Data

(63) Continuation of application No. PCT/JP2018/040067, filed on Oct. 29, 2018.

(30) Foreign Application Priority Data

Nov. 6, 2017 (JP) .............................. JP2017-213724

(51) Int. Cl.
*H01L 21/02* (2006.01)
*H01L 21/304* (2006.01)
*H01L 21/683* (2006.01)
*H01L 21/78* (2006.01)

(52) U.S. Cl.
CPC .. *H01L 21/02013* (2013.01); *H01L 21/02354* (2013.01); *H01L 21/304* (2013.01); *H01L 21/6836* (2013.01); *H01L 21/78* (2013.01)

(58) Field of Classification Search
CPC ......... H01L 21/02013; H01L 21/02354; H01L 21/304; H01L 21/6836; H01L 21/78;
(Continued)

(56) References Cited

U.S. PATENT DOCUMENTS

2005/0170559 A1* 8/2005 Hurtado .................. H01L 21/78
438/113
2007/0158314 A1* 7/2007 Fukumitsu ........... B28D 5/0052
219/121.6
(Continued)

FOREIGN PATENT DOCUMENTS

JP     2004-1076 A     1/2004
JP     2009-182099 A   8/2009
(Continued)

OTHER PUBLICATIONS

Korean Office Action, dated May 12, 2020, for counterpart Korean Application No. 10-2020-7012050, with an English translation.
(Continued)

*Primary Examiner* — Charles D Garber
*Assistant Examiner* — S M Sohel Imtiaz
(74) *Attorney, Agent, or Firm* — Birch, Stewart, Kolasch & Birch, LLP

(57) ABSTRACT

To provide a wafer processing method which can simplify the wafer processing process and efficiently obtain chips of stable quality. A wafer processing method includes: a tape attaching step of attaching a back grinding tape to the front surface of a wafer; a modified region forming step of applying a laser beam from the back surface of the wafer along a cut line to form modified regions inside the wafer; a back surface processing step of processing the back surface of the wafer having the modified regions to reduce a thickness of the wafer; and a dividing step of, in a state in which the back grinding tape is attached to the front surface of the wafer, applying a load to the cut line from the back surface of the wafer to divide the wafer along the cut line and obtain individual chips.

4 Claims, 12 Drawing Sheets

(58) Field of Classification Search
CPC ............... H01L 21/67; H01L 21/683; H01L 2221/63827; H01L 2221/6834; H01L 21/67132; H01L 21/67092; B23K 26/53; B28D 5/0005
See application file for complete search history.

(56) References Cited

U.S. PATENT DOCUMENTS

| | | | | |
|---|---|---|---|---|
| 2009/0011571 | A1* | 1/2009 | Kaneko | H01L 21/67092 438/463 |
| 2009/0191796 | A1* | 7/2009 | Kanazawa | B24B 37/042 451/54 |
| 2011/0048615 | A1* | 3/2011 | Fukaya | H01L 21/6836 156/154 |
| 2014/0339672 | A1* | 11/2014 | Yano | H01L 21/6836 257/499 |
| 2016/0042997 | A1* | 2/2016 | Takahashi | H01L 21/3043 438/464 |
| 2017/0005225 | A1* | 1/2017 | Okamoto | H01L 29/04 |
| 2018/0047651 | A1* | 2/2018 | Chen | H01L 24/97 |
| 2018/0320031 | A1 | 11/2018 | Mori et al. | |

FOREIGN PATENT DOCUMENTS

| | | | |
|---|---|---|---|
| JP | 2013-4583 A | | 1/2013 |
| JP | 2013004583 A | * | 1/2013 |
| JP | 2014-165462 A | | 9/2014 |
| JP | 2014165462 A | * | 9/2014 |
| JP | 2016-40079 A | | 3/2016 |
| JP | 2017-17163 A | | 1/2017 |
| JP | 2017-98331 A | | 6/2017 |
| KR | 10-2013-0084206 A | | 7/2013 |
| WO | WO 2017-036512 A1 | | 3/2017 |
| WO | WO 2017/104670 A1 | | 6/2017 |

OTHER PUBLICATIONS

International Preliminary Report on Patentability issued in PCT/JP2018/040067 (PCT/IPEA/409), dated Aug. 6, 2019.
International Search Report issued in PCT/JP2018/040067 (PCT/ISA/210), dated Dec. 4, 2018.
Written Opinon of the International Searching Authority issued in PCT/JP2018/040067 (PCT/ISA/237), dated Dec. 4, 2018.
Korean Decision of Rejection for Amendment for counterpart Korean Application No. 10-2020-7012050, dated Oct. 19, 2020, with English translation.
Korean Notice of Final Rejection for counterpart Korean Application No. 10-2020-7012050, dated Oct. 19, 2020, with English translation.
Korean Office Action, dated Sep. 8, 2020, for corresponding Korean Application No. 10-2020-7012050, with an English machine translation.

* cited by examiner

METHOD FOR PROCESSING WAFER

CROSS-REFERENCE TO RELATED APPLICATIONS

The present application is a Continuation of PCT International Application No. PCT/JP2018/040067 filed on Oct. 29, 2018 claiming priority under 35 U.S.C § 119(a) to Japanese Patent Application No. 2017-213724 filed on Nov. 6, 2017. Each of the above applications is hereby expressly incorporated by reference, in their entirety, into the present application.

BACKGROUND OF THE INVENTION

1. Field of the Invention

The present invention relates to a wafer processing method in which a wafer is divided into individual chips.

2. Description of the Related Art

Japanese Patent Application Laid-Open No. 2004-1076 (hereinafter referred to as "Patent Literature 1") discloses a laser processing method. In the laser processing method, a back surface of a wafer is ground in a state in which a protective tape is attached to a front surface of the wafer, and thereafter, modified regions are formed inside the wafer and the wafer is cut using the modified regions as starting points.

Further, Patent Literature 1 discloses that a material which can absorb shock and be removed by ultraviolet-ray irradiation is selected as a material of the protective tape.

Japanese Patent Application Laid-Open No. 2009-182099 (hereinafter referred to as "Patent Literature 2") discloses that, when grinding (back-grinding) the back surface of the wafer, a surface protection film is attached to the front surface of the wafer in order to protect a chip formed on the front surface of the wafer.

Further, Patent Literature 2 discloses that a dicing film is attached to the back surface of the wafer when the back-grinding is completed, and then the surface protection tape is peeled off from the front surface of the wafer before dicing the wafer.

On the other hand, Japanese Patent Application Laid-Open No. 2016-40079 (hereinafter referred to as "Patent Literature 3") discloses a dicing device which forms scribe lines on the wafer in a state where a dicing tape is attached to the back surface of the wafer, and then, after placing a protective film on the front surface of the wafer, pressing a break bar against a substrate from the dicing tape side to divide the substrate along the scribe lines (See paragraph [0004] of Patent Literature 3). Further, Patent Literature 3 discloses a protective film which is made of PET (polyethylene terephthalate) having a thickness of 25 µm and exhibits no or little adhesiveness.

CITATION LIST

Patent Literature 1: Japanese Patent Application Laid-Open No. 2004-1076
Patent Literature 2: Japanese Patent Application Laid-Open No. 2009-182099
Patent Literature 3: Japanese Patent Application Laid-Open No. 2016-40079

SUMMARY OF THE INVENTION

As described above, according to Patent Literatures 1 and 2, when grinding the back surface of the wafer, a protective tape (Patent Literature 1) or a surface protection film (Patent Literature 2) is attached to the front surface of the wafer to protect the front surface of the wafer. Such a protective tape or surface protection film (hereinafter referred to as the back grinding tape) is generally peeled off from the front surface when the back-grinding is completed.

Here, an attempt to apply the dicing method disclosed in Patent Literature 3 as the method of dicing the wafer after the back-grinding involves the following problems.

First, the first problem is that it is necessary to perform re-attach operation. That is, after the peeling off of the back grinding tape from the front surface of the wafer, the back surface of the wafer is attached to the dicing tape and, further, the protective film is placed on the front surface of the wafer at the time of breaking. Therefore, the wafer processing process becomes rather complicated and a running cost increases.

Further, the second problem is that the protective tape placed on the front surface of the wafer exhibits a rather weak adhesiveness, which leads to the following problem. That is, when the wafer is divided by the break bar, a TEG (Test Element Group) or the like on the wafer street (cut line) is fractured and separated from the chip, resulting in a contamination. The wafer may be cleaned to remove the contamination; however some wafers do not allow cleaning depending upon devices formed on the chips. In the case of such a wafer, there is a problem that the contamination remains adhering to the wafer, and when the remaining contamination adheres to the surface having the devices in the post process of the dividing process, the resultant chips become defective.

In this way, in the conventional wafer processing method, the wafer processing process is rather complicated, and there is a problem that it is impossible to efficiently obtain chips of stable quality.

The present invention has been made in view of the circumstances. The present invention aims to provide a wafer processing method which can simplify the wafer processing process and efficiently obtain chips of stable quality.

To achieve the object mentioned above, a wafer processing method according to the present invention includes: a tape attaching step of attaching a back grinding tape to a front surface of a wafer; a modified region forming step of applying a laser beam from a back surface of the wafer along a cut line to form modified regions inside the wafer; a back surface processing step of processing the back surface of the wafer having the modified regions to reduce a thickness of the wafer; and a dividing step of, in a state in which the back grinding tape is attached to the front surface of the wafer, applying a load to the cut line from the back surface of the wafer to divide the wafer along the cut line and obtain individual chips.

According to the present invention, the back grinding tape is attached to the front surface of the wafer in the back surface processing, and then, in a state in which the back grinding tape is attached to the front surface of the wafer, a load is applied to the cut line from the back surface of the wafer to divide the wafer along the cut line. As a result, it is possible to simplify the wafer processing process. Further, the contamination generated at the time of the division of the wafer adheres to the back grinding tape which exhibits a strong adhesiveness. When the back grinding tape is then peeled off from the front surface of the wafer, the contamination which is adhering to the back grinding tape is removed from the wafer. Thus, it is possible to eliminate the problem of defective chips attributable to the remaining of the contamination on the wafer. Thus, according to the wafer processing method of the present invention, it is possible to simplify the wafer processing process and to efficiently obtain chips of stable quality.

Further, according to the present invention, when a load is applied to the cut line from the back surface of the wafer, the cut line is cut while the cut line portion of the wafer is gradually sinking into the back grinding tape. That is, the cut line is cut while a pair of chips situated on both sides of the cut line is gradually inclined. Thus, it is possible to eliminate the problem of chipping generation attributable to abrupt inclination of the chips.

In a mode of the present invention, it is preferable that the back grinding tape be formed by stacking a base material, an intermediate layer and an adhesive layer in this order, and the adhesive layer be attached to the front surface of the wafer.

According to the mode of the present invention, when a load is applied to the cut line from the back surface of the wafer, the cut line portion of the wafer gradually sinks into the adhesive layer of the back grinding tape so that it is possible to cause the chips to be gradually inclined.

In a mode of the present invention, it is preferable that bumps for the chips be formed on the front surface of the wafer, and the bumps be buried in the adhesive layer of the back grinding tape in the tape attaching step.

According to the mode of the present invention, the bumps are buried in the adhesive layer so that it is possible to enhance the adhesion force between the wafer and the back grinding tape due to the anchor effect. As a result, it is possible to prevent abrupt inclination of the chips due to the pressing load.

In a mode of the present invention, it is preferable that the back surface processing step include: a grinding step of grinding the back surface of the wafer: and a polishing step of chemimechanically polishing the back surface of the wafer after the grinding step.

According to the mode of the present invention, it is possible to remove a modified layer formed on the back surface of the wafer in a grinding step, and then to remove a damaged layer formed by the grinding step in a polishing step. Therefore, it is possible to process the back surface so as to be mirror-finished.

According to the present invention, it is possible to simplify the wafer processing process, and to efficiently obtain chips of stable quality.

DESCRIPTION OF EMBODIMENTS

In the following, a preferred embodiment of a wafer processing method according to the present invention will be described with reference to the attached drawings.

The wafer processing method of the embodiment is performed by a processing device including a laser dicing device 1 (laser dicer) (See FIG. 1), a grinding device 2 (grinder) (See FIG. 3), a conveying device (conveyor) (not shown) configured to convey a wafer processed by the laser dicing device 1 to the grinding device 2, and a dividing device 200 (divider) (See FIG. 5) configured to divide the wafer ground by the grinding device 2 into chips.

<Device Structure>

(1) Regarding the Laser Dicing Device 1

Figure 1:
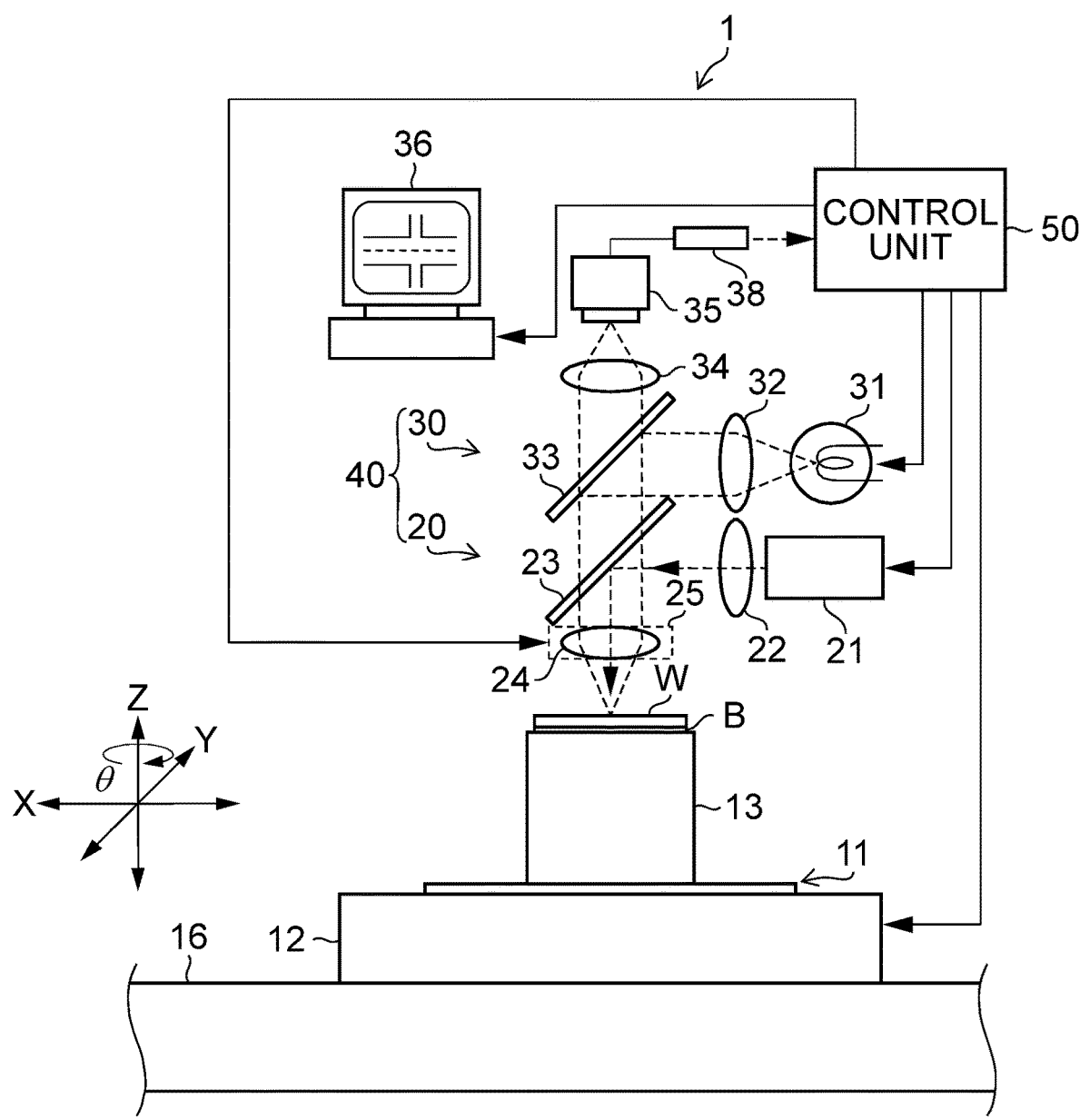
FIG. 1 is a schematic structural view of a laser dicing device.

FIG. 1 is a schematic structural view of the laser dicing device 1. As shown in FIG. 1, the laser dicing device 1 includes a wafer moving unit 11, a laser head 40, a control unit 50, etc. The laser head 40 includes a laser optical unit 20 and an observation optical unit 30.

The wafer moving unit 11 includes a suction stage 13 and an XYZθ-table 12. The suction stage 13 is configured to hold the wafer W through suction. The XYZθ-table 12 is provided on a main body base 16 of the laser dicing device 1 and configured to precisely move the suction stage 13 in the XYZθ-directions. With the wafer moving unit 11, the wafer W is precisely moved in the XYZθ-directions of FIG. 1.

In order to protect the front surface (device surface) having devices, a back grinding tape B having an adhesive layer on the surface thereof is attached to the front surface of the wafer W. The wafer W is then placed on the suction stage 13 such that the back surface faces upwards.

Figure 2:
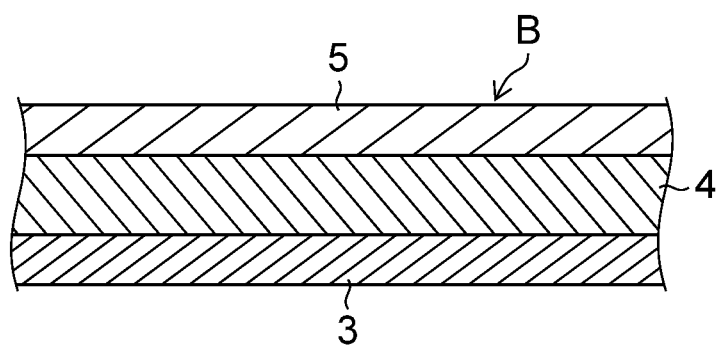
FIG. 2 is a schematic sectional view of a back grinding tape.

FIG. 2 is a schematic sectional view illustrating a structure of the back grinding tape B. The back grinding tape B is a tape which is attached to the front surface of the wafer W when processing the back surface of the wafer W. The back grinding tape B is a three-layered tape formed by stacking together a base film 3 constituting a base material, an intermediate absorption layer 4 having a thickness of 300 to 570 μm, and the above-mentioned adhesive layer 5. Although this structure is given by way of example, the adhesive layer 5 is a requisite component since unlike the above-mentioned protective film, the back grinding tape B is a highly adhesive tape. In a case where bumps BP (See FIG. 11) are formed on the device surface, which is the front surface of the wafer W, the back grinding tape B is attached to the wafer W in a state in which the bumps BP are buried in the adhesive layer 5 (See FIG. 2) so that the adhesive force of the back grinding tape B to the wafer W is enhanced due to an anchor effect. As a result, the back grinding tape B is not easily peeled off from the wafer W so that the wafer W can be conveyed from the laser dicing device 1 to the grinding device 2 in a state in which the front surface of the wafer W is protected by the back grinding tape B. Further, the wafer W can also be conveyed to the dividing device 200 (See FIG. 5) from the grinding device 2.

The laser optical unit 20 shown in FIG. 1 includes a laser oscillator 21, a collimating lens 22, a half mirror 23, a condensing lens 24, a driving means 25 (driver) configured to finely move a laser beam parallel to the wafer W, etc. The laser beam oscillated from the laser oscillator 21 is condensed inside the wafer W via the optical system including the collimating lens 22, the half mirror 23, the condensing lens 24, etc.

The observation optical unit 30 includes an observation light source 31, a collimating lens 32, a half mirror 33, a condensing lens 34, a CCD (Charge Coupled Device) camera 35, an image processing unit 38, a television monitor 36, etc.

In the observation optical unit 30, the back surface (upper surface) of the wafer W is irradiated with illumination light emitted from the observation light source 31 via the optical system including the collimating lens 32, the half mirror 33, the condensing lens 24, etc. The reflection light from the back surface of the wafer W enters the CCD camera 35 via the condensing lens 24, the half mirrors 23 and 33, and the condensing lens 34. The image of the surface of the wafer W is taken by the CCD camera 35.

The image data is input to the image processing unit 38 and used for the alignment of the wafer W, and is displayed on the television monitor 36 via the control unit 50.

The control unit 50 includes a CPU (Central Processing Unit), a memory, an input/output circuit, etc. The control unit 50 controls the operation of each unit of the laser dicing device 1.

The laser beam L emitted from the laser oscillator 21 is applied to the interior of the wafer W via the optical system including the collimating lens 22, the half mirror 23, the condensing lens 24, etc. The position in the Z-direction of the condensing point of the applied laser beam L is accurately set at a predetermined position inside the wafer W through positional adjustment in the Z-direction of the wafer W by the XYZθ-table 12, etc.

In this state, the XYZθ-table 12 is fed in the X-direction which is the dicing direction, with feeding for processing. Thereby, one line of modified regions is formed inside the wafer W along the cut line of the wafer W. When one line of the modified regions is formed, the XYZθ-table 12 is index-fed (indexed) in the Y-direction by one pitch so as to similarly form modified regions along the next line. When the modified regions are formed along all the cut lines parallel to the X-direction, the XYZθ-table 12 is rotated by 90 degrees, and modified regions are similarly formed along all the cut lines orthogonal to the above-mentioned cut lines.

(2) Regarding the Grinding Device 2

Figure 3:
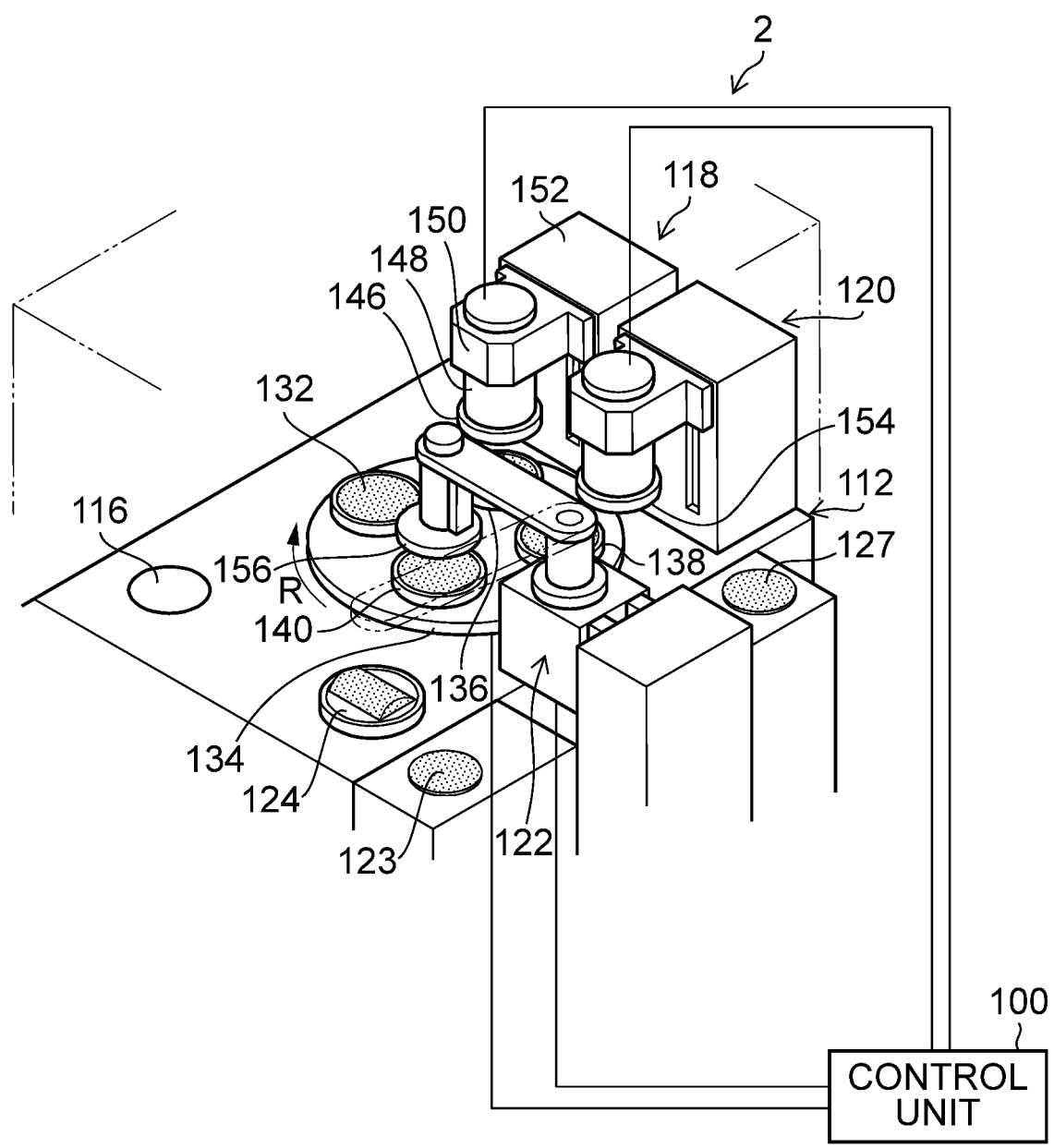
FIG. 3 is a schematic structural view of a grinding device.

FIG. 3 is a schematic structural perspective view of the grinding device 2. A main body 112 of the grinding device 2 includes an alignment stage 116, a rough grinding stage 118, a precision grinding stage 120, a polishing stage 122, a wafer cleaning stage 124, a polishing cloth cleaning stage 123, and a polishing cloth dressing stage 127. The grinding device 2 is a device configured to reduce a thickness of the wafer W by processing the back surface of the wafer W on which the modified regions have been formed.

Figure 4:
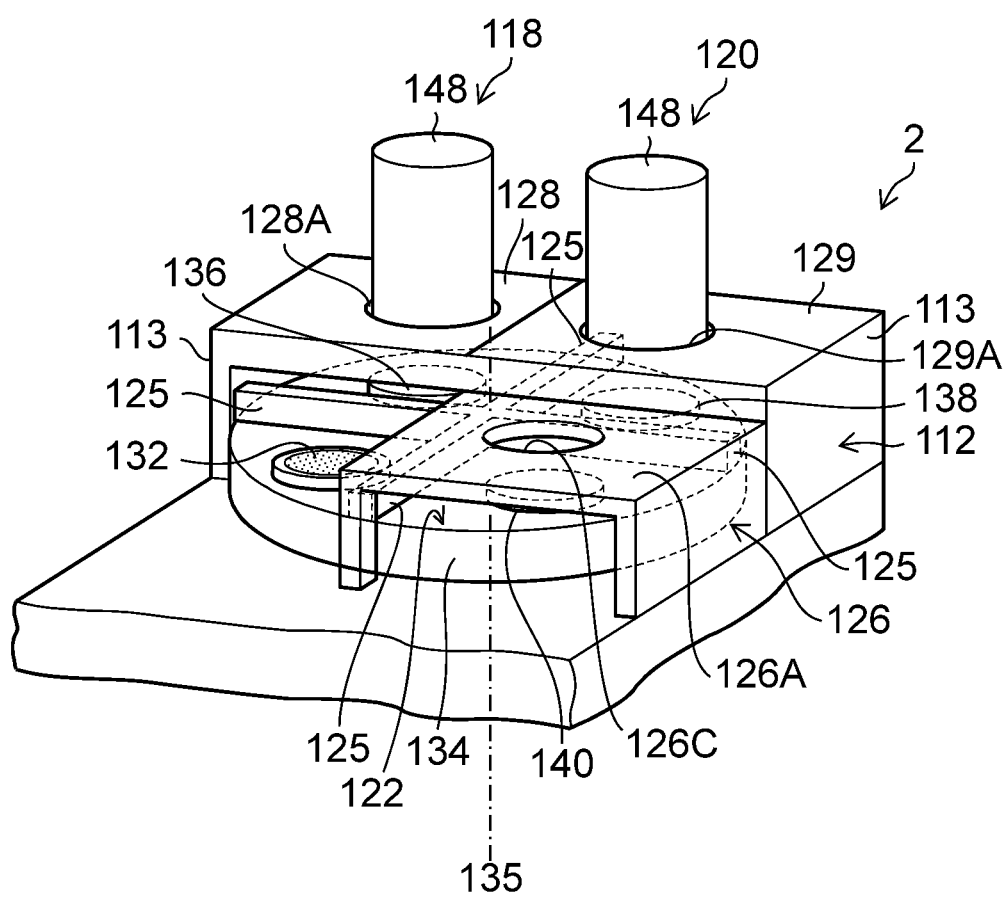
FIG. 4 is a partial enlarged view of the grinding device.

As shown in FIG. 4, the rough grinding stage 118, the precision grinding stage 120, and the polishing stage 122 are divided from each other by a partition 125 (not shown in FIG. 3), whereby the processing liquid used at each of the stages 118, 120, and 122 is prevented from being scattered to the adjacent stage.

As shown in FIG. 4, the partition 125 is fixed to an index table 134. The partition 125 is formed in a cross-shape so as to divide from each other four chucks 132, 136, 138, and 140 which are installed on the index table 134. The front surface of the wafer W is suction-held by these chucks 132, 136, 138, and 140 via the back grinding tape B.

The rough grinding stage 118 is a stage where rough polishing is performed, and is surrounded by a side surface 113 of the main body 112, a top plate 128, and the partition 125. The precision grinding stage 120 is a stage where precision polishing is performed, and is, like the rough grinding stage 118, surrounded by the side surface 113 of the main body 112, a top plate 129, and the partition 125. Through-holes 128A and 129A are formed in the top plates 128 and 129, and the head of each stage is inserted into the through-holes 128A and 129A.

The polishing stage 122 shown in FIG. 3 is used to perform chemimechanical polishing, and is, as shown in FIG. 4, covered with a casing 126 having a top plate 126A in order to isolate it from the other stages. Furthermore, the top plate 126A has a through-hole 126C, and the head of a polishing stage 122 is inserted into the through-hole 126. Because the polishing stage 122 is configured to perform chemimechanical polishing, a chemical polishing agent is contained in the polishing processing liquid.

In the polishing stage 122 shown in FIG. 3, the back surface of the wafer W is polished with a polishing cloth 156 and a slurry supplied from the polishing cloth 156, and a work-affected layer generated on the back surface of the wafer W is removed through rough polishing and precision polishing. The work-affected layer is a general term meaning a streak, processing distortion (affected crystal), etc. which are generated through the grinding.

The alignment stage 116 is a stage where the wafer W conveyed from the laser dicing device 1 by the conveying device (not shown) is aligned at a predetermined position. The wafer W aligned by the alignment stage 116 is suction-held by a conveying robot (not shown), and is then conveyed to the empty chuck 132. The back surface of the wafer W is suction-held by the suction surface of the chuck 132 via the back grinding tape B.

The chuck 132 is disposed on the index table 134. Further, chucks 136, 138, and 140 endowed with the same function with the chuck 132 are disposed around a rotation shaft 135 (See FIG. 4) of the index table 134 at an interval of 90 degrees. A spindle (not shown) of a motor (not shown) is connected to the rotation shaft 135.

In FIG. 3, the chuck 136 is arranged on the rough grinding stage 118 where rough grinding is performed on the sucked wafer W. In FIG. 3, the chuck 138 is arranged on the precision grinding stage 120 where finish grinding (precision grinding, spark out) is performed on the sucked wafer W. In FIG. 3, the chuck 140 is arranged on the polishing stage 122 where polishing is performed on the sucked wafer W to remove the work-affected layer generated through the grinding and variation in a thickness of the wafer W.

The control unit 100 shown in FIG. 3 includes a CPU, memory, an input/output circuit, etc. The control unit 100 is configured to control the operation of each unit of the grinding device 2.

The thickness of the wafer W suction-held by the chuck 132 is measured by a pair of measurement gauges (not shown) connected to the control unit 100. Each of these measurement gauges has a contactor, and one contactor is in contact with the upper surface (back surface) of the wafer W, and the other contactor is in contact with the upper surface of the chuck 132. Using the upper surface of the chuck 132 as a reference point, these measurement gauges can detect the thickness of the wafer W as a difference in the reading value of an in-process gage.

The index table 134 is rotated in the direction of arrow R in FIG. 3 by 90 degrees by the control unit 100 so as to place the wafer W whose thickness has been measured on the rough grinding stage 118. Then, the back surface of the wafer W is roughly ground by a cup-shaped grindstone 146 of the rough grinding stage 118. As shown in FIG. 3, this cup-shaped grindstone 146 is connected to an output shaft (not shown) of a motor 148, and is mounted to a grindstone feeding device 152 (grindstone feeder) via a support casing 150 for the motor 148.

The grindstone feeding device 152 moves the cup-shaped grindstone 146 up-and-down along with the motor 148. Through the lowering of the grindstone feeding device 152, the cup-shaped grindstone 146 is pressed against the back surface of the wafer W. As a result, the back surface of the wafer W is rough-ground.

The control unit 100 sets the lowering amount (amount of downward movement) of the cup-shaped grindstone 146, and controls the motor 148. The lowering amount of the cup-shaped grindstone 146, that is, the grinding amount by the cup-shaped grindstone 146, is set based on a previously registered reference position of the cup-shaped grindstone 146 and the thickness of the wafer W detected by the measurement gauges. Further, the control unit 100 controls the number of revolutions of the motor 148, thereby controlling the number of revolutions of the cup-shaped grindstone 146.

The thickness of the wafer W whose back surface has been roughly ground at the rough grinding stage 118 is measured by the measurement gauges (not shown) connected to the control unit 100 after the cup-shaped grindstone 146 has retracted from the wafer W. The index table 134 is rotated in the direction of arrow R of FIG. 3 by 90 degrees by the control unit 100 so as to place the wafer W whose thickness has been measured on the precision grinding stage 120. Then, the precision grinding and spark out are performed on the wafer W with a cup-shaped grindstone 154 of the precision grinding stage 120. The structure of the precision grinding stage 120 is the same as that of the rough grinding stage 118, so a description thereof will be left out. The grinding amount with the cup-shaped grindstone 154 is set by the control unit 100, and a processing moving amount and a number of revolutions of the cup-shaped grindstone 154 are controlled by the control unit 100.

The thickness of the wafer W whose back surface has been precisely ground by the precision grinding stage 120 is measured by the measurement gauges (not shown) connected to the control unit 100 after the cup-shaped grindstone 154 has retracted. When the index table 134 is rotated in the direction of arrow R of FIG. 3 by 90 degrees by the control unit 100, the wafer W whose thickness has been measured is placed on the polishing stage 122. Then, the chemimechanical polishing is conducted by the polishing cloth 156 of the polishing stage 122 in order to apply mirror finishing on the back surface of the wafer W. The up-down moving distance of the polishing cloth 156 is set by the control unit 100. Further, a motor 182 is controlled by the control unit 100 in order to control the position of the polishing cloth 156. Further, a number of revolutions of the motor 158, that is, a number of revolutions of the polishing cloth 156, is controlled by the control unit 100.

(3) On the Dividing Device 200

Figure 5:
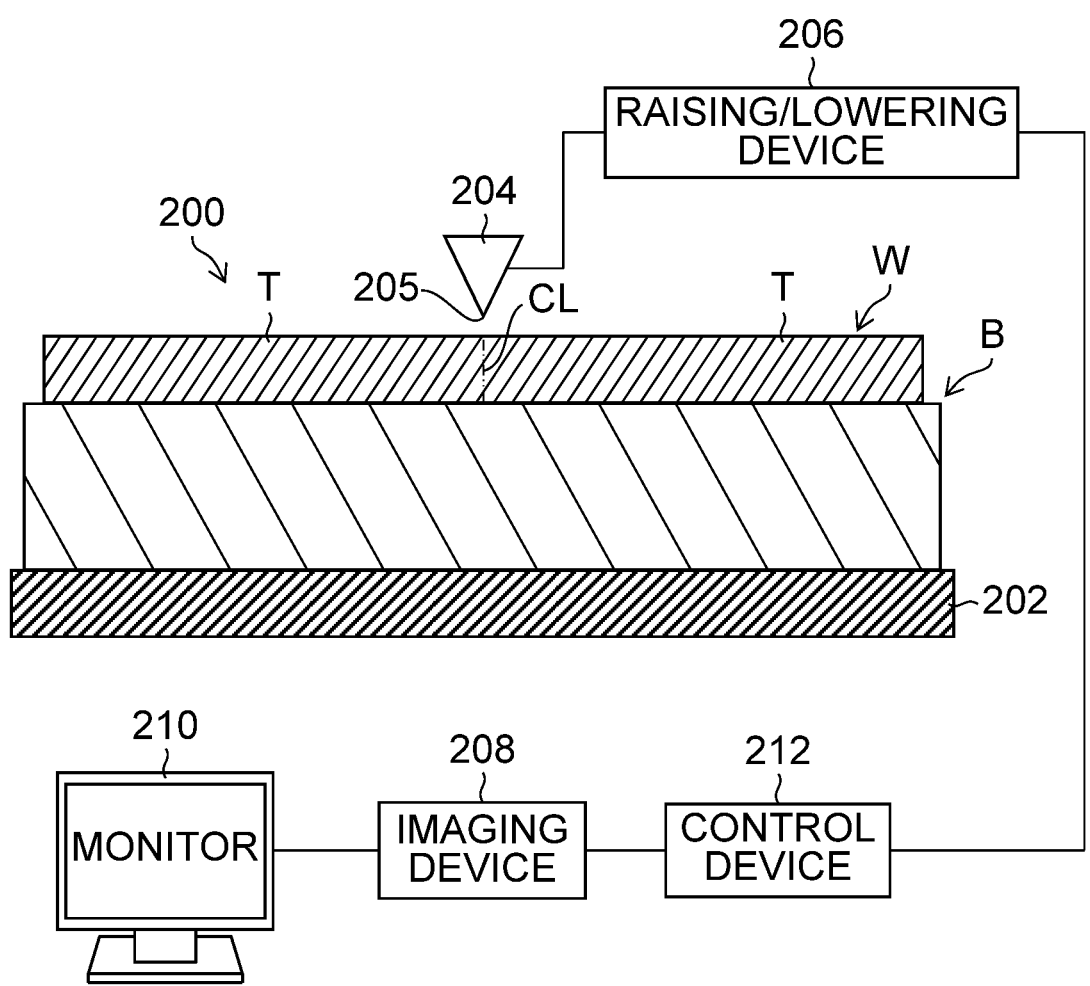
FIG. 5 is a schematic structural view of a dividing device according to an embodiment.

FIG. 5 is a schematic structural view of the dividing device 200. The dividing device 200 according to the embodiment is a device configured to divide the wafer W along the cut line by applying a load to the cut line from the back surface of the wafer W in a state in which the back grinding tape B has been attached to the front surface of the wafer W. Thereby, the wafer W is divided into individual chips T.

The dividing device 200 includes a sheet 202, a break bar 204, a raising/lowering device 206 (lifter), an imaging device 208 (imager), a display device 210 (displayer), and a control device 212 (controller). The sheet 202 of a transparent rubber is configured to be placed on the front surface of the wafer W with the back grinding tape B interposed between the sheet 202 and the wafer. The break bar 204 is configured to press down the cut line CL from the back surface (upper surface) of the wafer W. The raising/lowering device 206 is configured to move the break bar 204 up-and-down relative to the sheet 202. The imaging device 208 is configured to image the wafer W via the sheet 202. The display device 210 is configured to display the image taken by the imaging device 208. The control device 212 is configured to control the raising/lowering device 206, the imaging device 208, etc.

Figure 6:
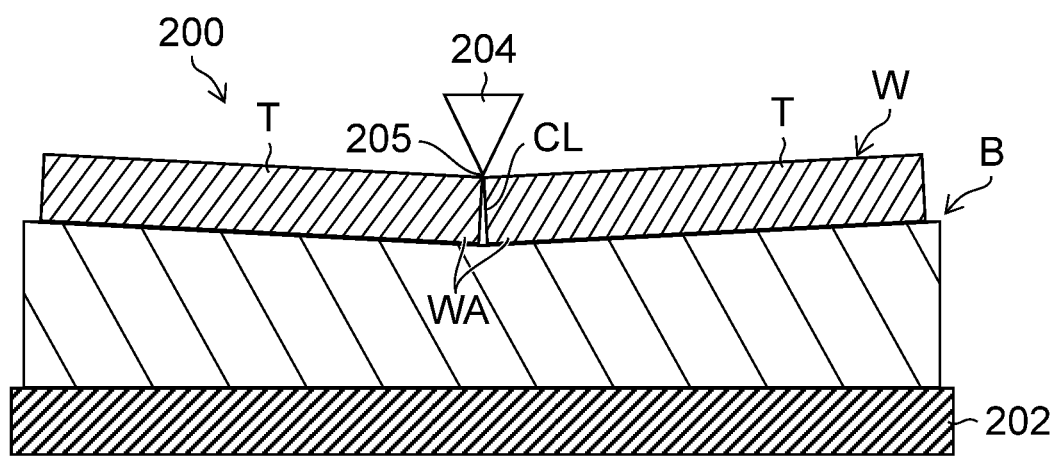
FIG. 6 is a diagram illustrating the operation of the dividing device shown in FIG. 5.

The length of the break bar 204 is longer than the longest cut line CL of the wafer W, and its distal end portion is formed to have a triangular shape in cross-section. As shown in FIG. 6, an apex portion 205 at the distal end of the break bar 204 presses down the modified regions. As a result, the press-down load by the break bar 204 is applied to the modified regions, so that the wafer W is divided along the cut line CL. The condition of dividing the wafer W is imaged by the imaging device 208 via the sheet 202. The image is displayed on the display device 210 so that it is possible to visually check the dividing condition of the wafer W.

<Method of Processing the Wafer W>

Figure 7:
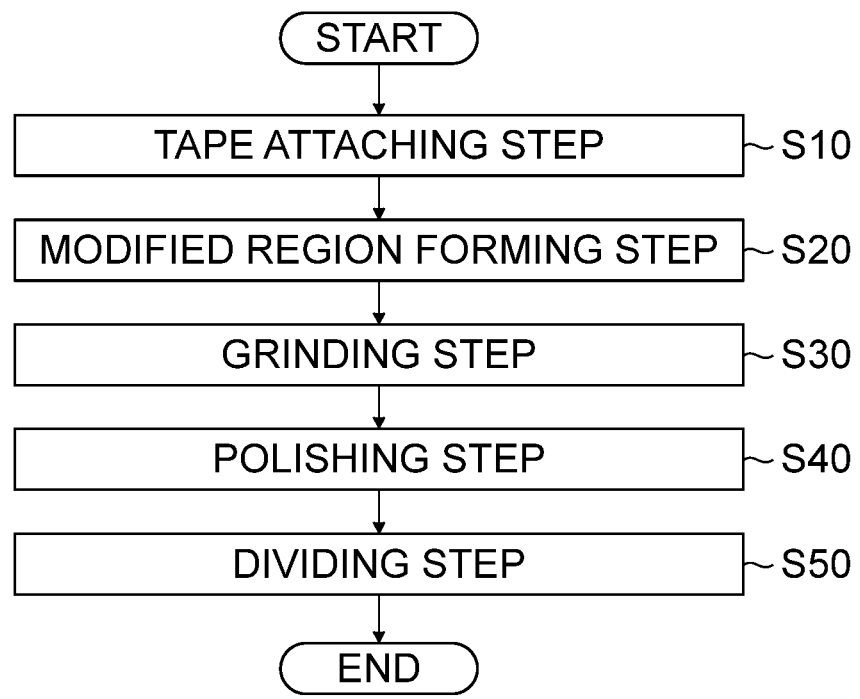
FIG. 7 is a flowchart illustrating a processing flow of a method of cutting a semiconductor substrate.
Figure 8:
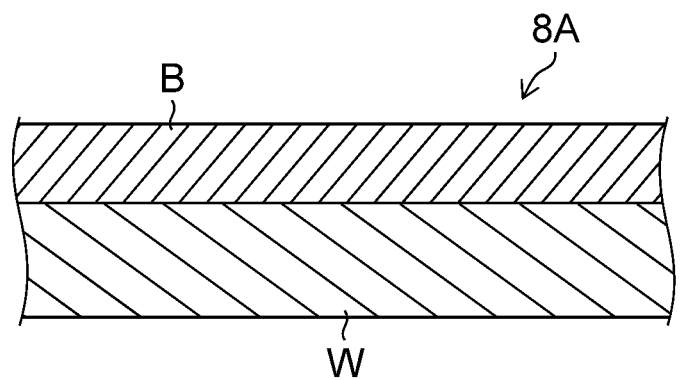
FIG. 8 is an explanatory view illustrating processing states of a wafer corresponding to the flowchart of FIG. 7.
Figure 8:
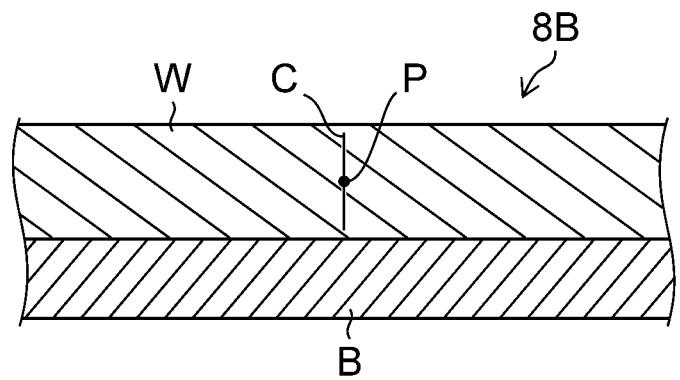
Figure 8:
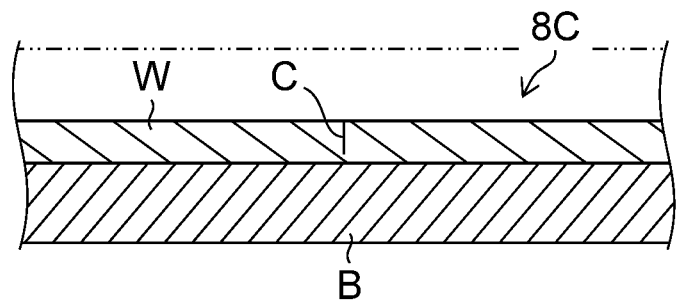

Next, the method of processing the wafer W will be described. FIG. 7 is a flowchart illustrating the flow of the method of processing the wafer W. Further, FIG. 8 is an explanatory view illustrating the condition of the wafer W corresponding to the flowchart of FIG. 7. In the following, the method will be described with reference to FIGS. 7 and 8.

(1) Tape Attaching Step (Step S10)

The back grinding tape B is attached to the front surface of the wafer W. Reference numeral 8A of FIG. 8 illustrates the wafer W in a state where the back grinding tape B has been attached to the front surface of the wafer W.

(2) Modified Region Forming Step (Step S20)

As shown in FIG. 1, the wafer W with the back grinding tape B attached to its front surface is placed on the suction stage 13 of the laser dicing device 1 such that the back surface of the wafer W faces upwards. The following processing is conducted on the laser dicing device 1, and is controlled by the control unit 50.

When the laser beam L is emitted from the laser oscillator 21, the laser beam L is applied to the interior of the wafer W via the optical system such as the collimating lens 22, the half mirror 23, the condensing lens 24, etc., and modified regions are formed inside the wafer W along the cut line. Reference numeral 8B of FIG. 8 illustrates the modified region P inside of the wafer W and a crack C formed in the thickness direction of the wafer W extending from the modified region P.

In the embodiment, for an example, because the chip finally produced has a thickness of 50 μm, the laser beam is applied to the wafer W at a depth (distance) of 60 μm to 80 μm from the surface (lower surface) of the wafer W. After the modified regions P have been formed along all the cut lines, the processing of step S20 is completed.

(3) Grinding Step (Step S30)

After the modified regions have been formed along all the cut lines CL by the modified region forming step (step S20), the wafer W is conveyed from the laser dicing device 1 to the grinding device 2 of FIG. 3 by the conveying device (not shown). The following processing is conducted by the grinding device 2, and is controlled by the control unit 100.

The conveyed wafer W is placed on the chuck 132 (which may also be the chuck 136, 138, or 140) in such a manner that the back grinding tape B attached to the front surface of the wafer W faces downward, and the front surface of the wafer W is vacuum-sucked to the chuck 132 via the back grinding tape B.

Next, the index table 134 is rotated around the rotation shaft 135 to convey the chuck 132 to the rough grinding stage 118, and rough grinding is performed on the wafer W.

The rough grinding is conducted by rotating the cup-shaped grindstone 146 while rotating the chuck 132. In the embodiment, for an example, Vitrified #325 manufactured by Tokyo Seimitsu, Co., Ltd. is used as the cup-shaped grindstone 146. The number of revolutions of the cup-shaped grindstone 146 is 3000 rpm (rpm: revolution per minute).

After the rough polishing, the index table 134 is rotated around the rotation shaft 135 to convey the chuck 132 to the precision grinding stage 120, where precision polishing is performed on the wafer W by rotating the cup-shaped grindstone 154 while rotating the chuck 132. In the embodiment, for an example, Resin #2000 manufactured by Tokyo Seimitsu, Co., Ltd. is used as the cup-shaped grindstone 154, and the number of revolutions of the cup-shaped grindstone 154 is 2400 rpm.

In the embodiment, grinding is performed through rough polishing and precision polishing to reach the target surface, that is, to a depth of 50 µm from the front surface of the wafer W. In the embodiment grinding is performed by a grinding amount of 700 µm through rough polishing, and then by a grinding amount of 30 to 40 µm through precision polishing. However, there is no need to strictly set these grinding amounts. It may be also possible to determine the grinding amount such that the time for rough polishing and the time for precision polishing are the same.

The grinding step makes it possible to remove the modified regions on the back surface of the wafer W formed in the modified region forming step through the grinding step. As a result, chips obtained as final products do not include no modified regions P generated by the laser beam, in the cross-section of the chips. Thus, it is possible to prevent breakage of the modified layer in the cross-section of the chips so as not to cause fracture starting from the broken portion, and to prevent dust generation from the broken portion.

(4) Polishing Step (Step S40)

The polishing step is conducted by the grinding device 2, and is controlled by the control unit 100.

After the precision polishing, the index table 134 is rotated around the rotation shaft 135 to convey the chuck 132 to the polishing stage 122 of FIG. 3, where chemimechanical polishing is performed by the polishing cloth 156 of the polishing stage 122. Through this process, it is possible to remove the work-affected layer formed on the back surface of the wafer W in the grinding step so that the back surface of the wafer W is mirror-finished. Reference numeral 8C of FIG. 8 illustrates the wafer W whose back surface is mirror-finished after grinding and polishing processings.

In the embodiment, a polyurethane-impregnated non-woven cloth (e.g., TS200L manufactured by Tokyo Seimitsu Co., Ltd.) is used as the polishing cloth 156, colloidal silica is used as the slurry, and the number of revolutions of the polishing cloth 156 is 300 rpm.

(5) Dividing Step (Step S50)

The dividing step is conducted by the dividing device 200 of FIG. 5, and is controlled by the control device 212.

In the dividing device 200, the front surface of the wafer W is placed on the sheet 202 in a state where the back grinding tape B has been attached to the front surface of the wafer W in such a manner that the back grinding tape B is interposed between the wafer W and the sheet 202. Next, relative positional adjustment is performed such that the position of the first cut line CL of the wafer W and the position of the break bar 204 coincide with each other in the up-down direction.

Next, the break bar 204 at a position retracted from the back surface of the wafer W is moved downward by the raising/lowering device 206, and the back surface of the wafer W is pressed down by the apex portion 205 of the break bar 204. As a result, a load is applied to the crack C from the back surface of the wafer W, and cutting is effected along the first cut line CL. This operation is conducted on all the cut lines, whereby the wafer W is cut along all the cut lines to divide the wafer W into chips T.

The contamination generated at the time of the division of the wafer W adheres to the adhesive layer 5 (See FIG. 2) of the back grinding tape B, which has strong adhesive force. When the back grinding tape B is peeled off from the front surface of the wafer W, the contamination which is adhering to the adhesive layer 5 of the back grinding tape B is removed from the wafer W. As a result, it is possible to eliminate the problem of a defective chip attributable to the remaining of the contamination on the wafer W.

In this way, in the method of processing the wafer W according to the embodiment, the back grinding tape B is attached to the front surface of the wafer W when grinding the back surface of the wafer W, and then, in a state in which the back grinding tape B which has been attached to the front surface of the wafer W is not peeled off, a load is applied to the cut line CL from the back surface of the wafer W to cut the wafer W along the cut line. Therefore, it is possible to simplify the wafer processing step and to efficiently obtain chips of stable quality.

In the dividing step of the embodiment, when the load is applied to the cut line CL from the back surface of the wafer W by the break bar 204, the wafer W is cut along the cut line CL while the portion WA of the wafer W in the vicinity of the cut line CL is gradually sinking in the back grinding tape B as shown in FIG. 6. In other words, the wafer W is cut along the cut line CL while the chips T situated on both sides of the cut line CL are gradually inclined. As a result, it is possible to eliminate the problem of chipping generation attributable to abrupt inclination of the chips T.

By the way, in some cases, when the break bar 204 is pressed against the back surface of the wafer W in a state in which a conventional protective film is attached to the front surface of the wafer on which bumps are formed, the chips T are abruptly inclined to generate chipping.

That is, until the pressing load reaches to a predetermined pressing load, the bumps support the chips to the protective film so that no bending stress is applied to the chips and the chips are pressed in a direction perpendicular to the back surface of the wafer. And when the pressing load exceeds the predetermined pressing load, the bumps start to slip on the protective film, whereby the chips are abruptly inclined, and the interval between the chips becomes excessively large. When this phenomenon occurs, chipping is likely to be generated in the chips because the break bar 204 comes into contact with the end portions of the chips and the adjacent chips collide with each other, when the chips are restored to the former positions.

In contrast, in the method of processing the wafer W of the embodiment, even a wafer which has bumps on the front surface can be divided in a satisfactory manner. In the following, this will be described.

Figure 9:
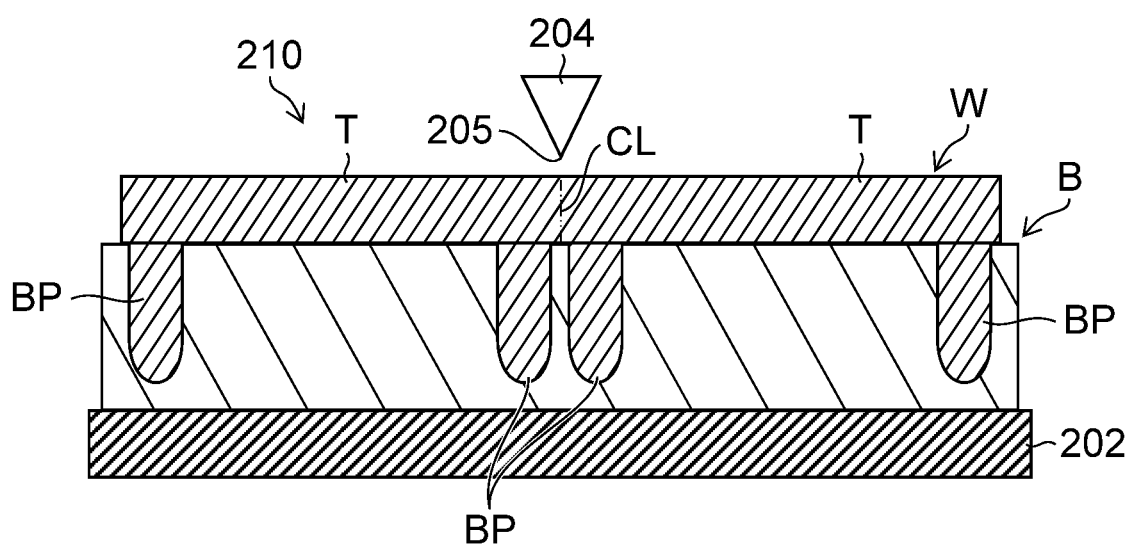
FIG. 9 is an explanatory view illustrating how the wafer on which a bump is formed is divided by the dividing device of FIG. 5.

As shown in FIG. 9, a bump BP is formed for each chip T on the front surface of the wafer W, and the back grinding tape B is attached to the front surface of the wafer W. In the wafer W on which the bumps BP are formed, the back grinding tape B is attached in such a manner that the bumps BP are buried in the adhesive layer 5 of the back grinding tape B.

Figure 10:
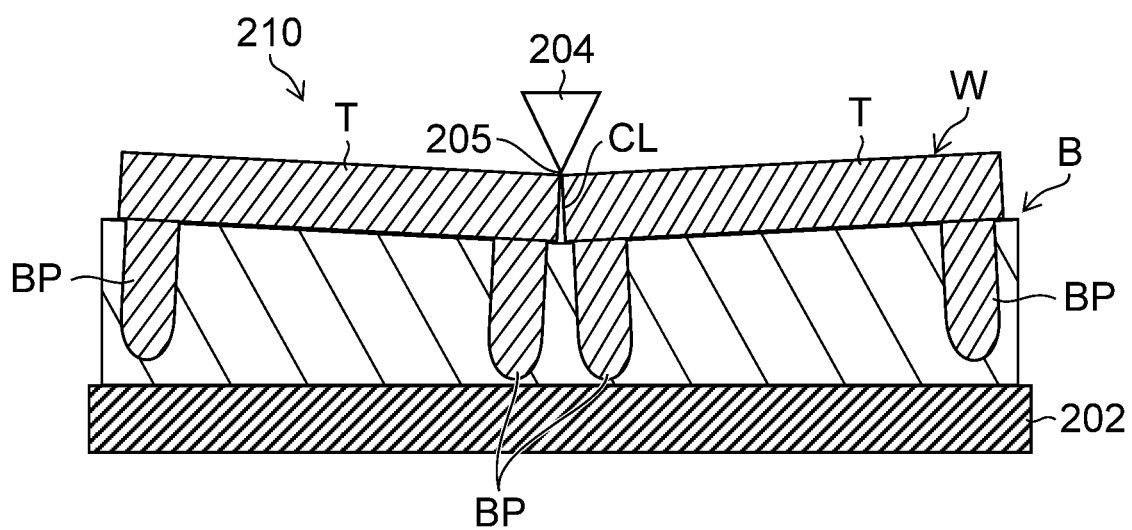
FIG. 10 is an explanatory view illustrating the operation of the dividing device shown in FIG. 9.

When the wafer W of FIG. 9 is divided by the dividing device 200 of FIG. 5, due to the anchor effect of the bumps BP buried in the adhesive layer 5, the adhesive force between the wafer W (chip T) and the back grinding tape B is enhanced. Therefore, even when the break bar 204 is pressed against the back surface of the wafer W as shown in FIG. 10, it is possible to further prevent abrupt inclination of the chips T. Thus, even the wafer W of FIG. 9 on which the bump BP is formed can be divided in a satisfactory manner.

Figure 11:
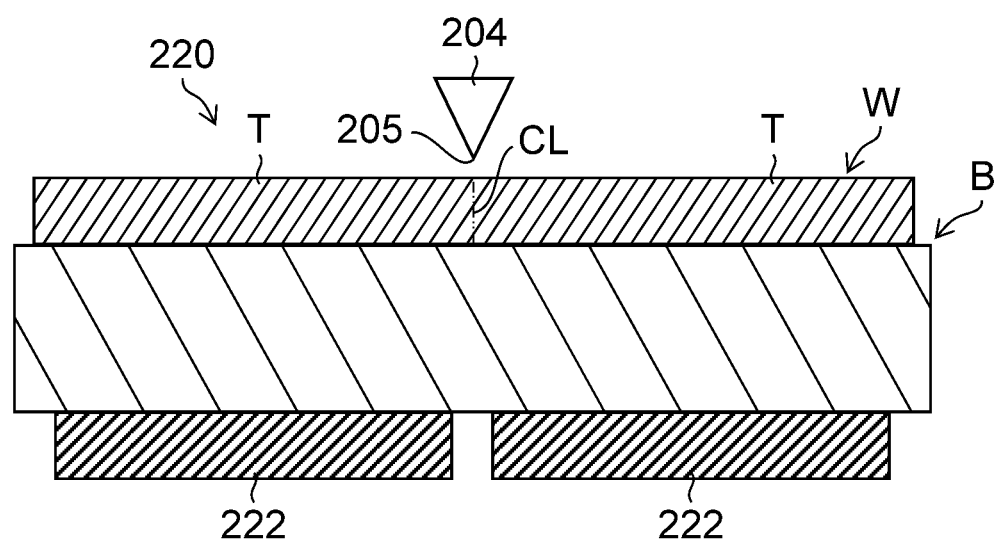
FIG. 11 is a schematic structural view of a dividing device according to another embodiment.

FIG. 11 is a schematic structural view of a dividing device 220 according to another embodiment. The dividing device 220 differs from the dividing device 200 shown in FIG. 5 in that the dividing device 220 includes a pair of receiving plates 222 (supporting plates) instead of the sheet 202. Otherwise, it is the same as the dividing device 200. The pair of receiving plates 222 are arranged at an interval in the horizontal direction, and the cut line CL of the wafer W is arranged between the receiving plates 222.

When the wafer W is to be divided by using the dividing device 220 of FIG. 11, the front surface of the wafer W is first placed on the pair of receiving plates 222 via the back grinding tape B. Next, the first cut line CL to be cut is arranged between the pair of receiving plates, and the position of the first cut line CL and the position of the break bar 204 are caused to relatively coincide with each other in the up-down direction.

Figure 12:
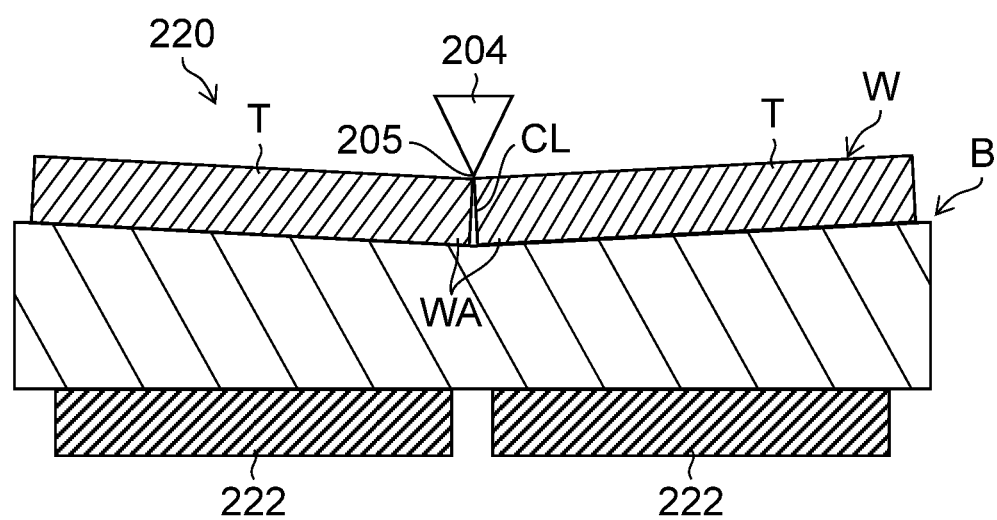
FIG. 12 is an explanatory view illustrating an operation of the dividing device shown in FIG. 11.

Next, as shown in FIG. 11, the break bar 204 is moved downward by the raising/lowering device 206 (See FIG. 5), and, as shown in FIG. 12, the cut line CL is pressed down from the back surface of the wafer W by the apex portion 205 of the break bar 204. As a result, a load is applied to the modified regions from the back surface of the wafer W, and the cut line CL is cut.

As in the case of the dividing device 200 of FIG. 5, also in the case of the dividing device 220 of FIG. 11, the contamination generated at the time of dividing the wafer W adheres to the adhesive layer 5 (See FIG. 2) of the back grinding tape B, which has a strong adhesive force. When the back grinding tape B is peeled off from the front surface of the wafer W, the contamination which is adhering to the adhesive layer 5 of the back grinding tape B is removed from the wafer W. Thus, it is possible to eliminate the problem of defective chips attributable to the remaining of the contamination on the wafer W.

Thus, also in the dividing device 220, it is possible to efficiently obtain chips of stable quality.

Further, as shown in FIG. 12, when a load is applied to the cut line CL from the back surface of the wafer W by the break bar 204, the wafer W is cut along the cut line CL while the portion WA of the wafer W in the vicinity of the cut line CL is gradually sinking in the back grinding tape B. In other words, the wafer W is cut along the cut line CL while the chips T situated on both sides of the cut line CL is gradually inclined. As a result, it is possible to eliminate the problem of chipping generation attributable to abrupt inclination of the chips T.

REFERENCE SIGNS LIST

1 . . . laser dicing device, 2 . . . grinding device, W . . . wafer, B . . . back grinding tape, 11 . . . wafer moving unit, 13 . . . suction stage, 20 . . . laser optical unit, 30 . . . observation optical unit, 40 . . . laser head, 50 . . . control unit, 100 . . . control unit, 118 . . . rough grinding stage, 120 . . . precision grinding stage, 122 . . . polishing stage, 132, 136, 138, 140 . . . chuck, 146, 154 . . . cup-shaped grindstone, 156 . . . polishing cloth, 200 . . . dividing device, 202 . . . sheet, 204 . . . break bar, 205 . . . apex portion, 206 . . . raising/lowering device, 208 . . . imaging device, 210 . . . display device, 212 . . . control device, 220 . . . dividing device, 222 . . . receiving plate.

The invention claimed is:

1. A wafer processing method comprising:
attaching a back grinding tape to a front surface of a wafer, wherein bumps of chips which are formed on the front surface of the wafer are buried in an adhesive layer of the back grinding tape;
applying a laser beam from a back surface of the wafer along a cut line to form modified regions inside the wafer;
processing the back surface of the wafer having the modified regions to reduce a thickness of the wafer; and
in a state in which the back grinding tape is attached to the front surface of the wafer, applying a load to the cut line by a break bar of a dividing device from the back surface of the wafer to cause a portion in a vicinity of the cut line sink in the back grinding tape gradually and cause the chips situated on both sides of the cut line incline gradually to divide the wafer along the cut line and obtain individual chips.

2. The wafer processing method according to claim 1, wherein the back grinding tape is formed by stacking a base material, an intermediate layer and the adhesive layer in this order, and
the adhesive layer is to be attached to the front surface of the wafer.

3. The wafer processing method according to claim 1, wherein the processing the back surface, includes:
grinding the back surface of the wafer; and
chemimechanically polishing the back surface of the wafer after the grinding step.

4. The wafer processing method according to claim 1, wherein the adhesive layer is to be attached to the front surface of the wafer.

* * * * *